United States Patent [19]
Matsunaga

[11] Patent Number: 5,432,551
[45] Date of Patent: Jul. 11, 1995

[54] INTERLINE TRANSFER IMAGE SENSOR

[75] Inventor: Yoshiyuki Matsunaga, Kanagawa, Japan

[73] Assignee: Kabushiki Kaisha Toshiba, Kanagawa, Japan

[21] Appl. No.: 974,741

[22] Filed: Nov. 13, 1992

[30] Foreign Application Priority Data

Nov. 15, 1991 [JP] Japan .................. 3-300148

[51] Int. Cl.⁶ ............. H01L 29/78; H01L 27/14; H01L 31/00
[52] U.S. Cl. .................. 348/299; 348/290; 348/298; 348/303; 348/314; 348/316; 348/319; 348/320; 257/223; 257/230; 257/232; 257/233; 257/236
[58] Field of Search .......... 257/223, 229, 230, 231, 257/232, 233, 236; 348/290, 298, 299, 303, 314, 316, 319, 320

[56] References Cited

U.S. PATENT DOCUMENTS

| 4,477,735 | 5/1984 | Horii | 257/232 |
| 4,696,021 | 9/1987 | Kawahara et al. | 257/229 |
| 4,912,560 | 3/1990 | Osawa et al. | 358/213 |

FOREIGN PATENT DOCUMENTS

| 60-32486 | 2/1985 | Japan | 257/232 |
| 60-203076 | 10/1985 | Japan | 257/233 |
| 60-244068 | 12/1985 | Japan | 257/223 |
| 63-268269 | 11/1988 | Japan | 257/229 |
| 2-303136 | 12/1990 | Japan | 257/229 |

OTHER PUBLICATIONS

"A Photoelectric Conversion-Characteristic Control Method for Interline Transfer CCD Imager", IEEE Transactions on Electron Devices, vol. ED-32, No. 8, Aug. 1985, pp. 1511-1513.

*Primary Examiner*—Ngán V. Ngó
*Attorney, Agent, or Firm*—Finnegan, Henderson, Farabow, Garrett & Dunner

[57] ABSTRACT

The present invention is directed toward an image sensor array comprising a plurality of pixels. Each pixel includes a photodiode and a CCD channel region. An overflow drain region is provided adjacent the CCD channel region for extraction of excess charges. An insulated gate read-out transfer electrode is further provided above the CCD channel region and a portion of the substrate between the CCD channel region and the photodiode. Three different potentials are applied to the read-out transfer electrode for respectively storing charge in the photodiode, extracting excess charge from the photodiode while allowing signal charge to remain in the photodiode, and reading out signal charge from the photodiode.

13 Claims, 7 Drawing Sheets

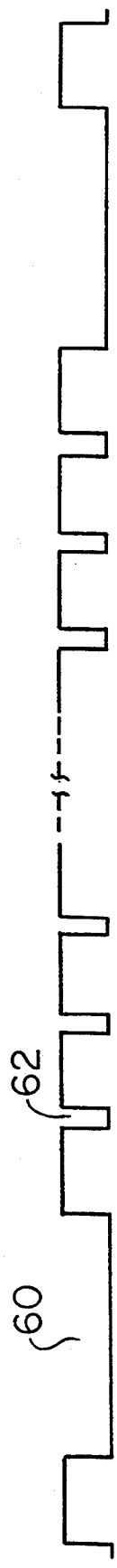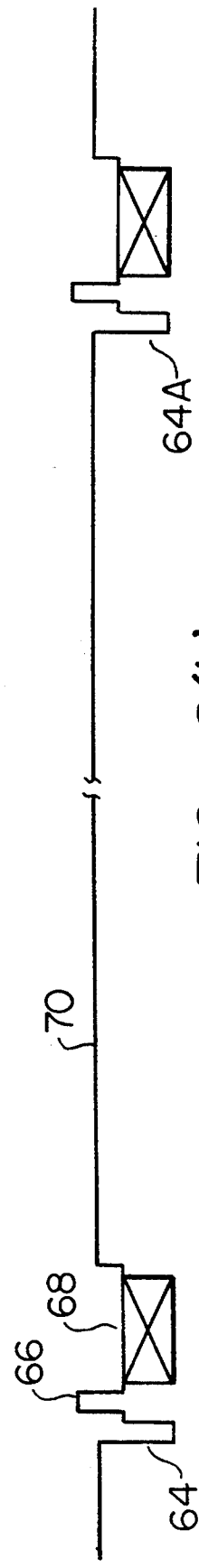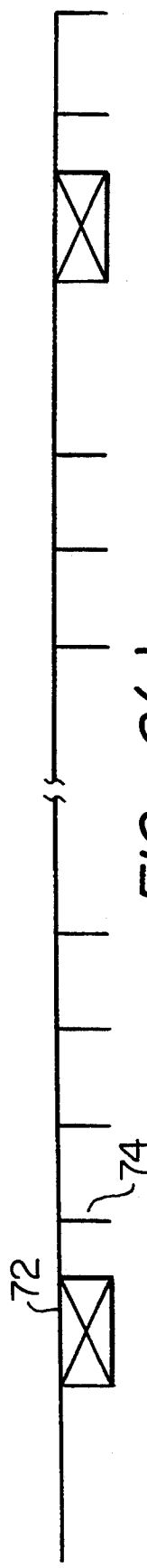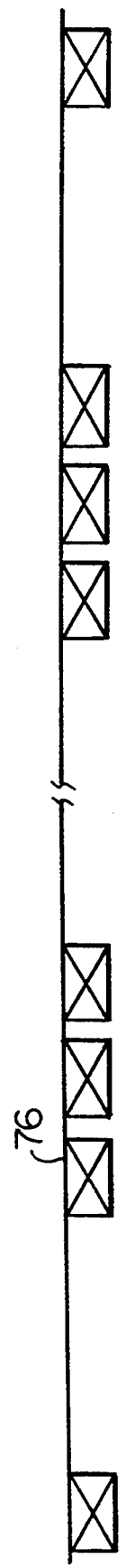

INTERLINE TRANSFER IMAGE SENSOR

BACKGROUND OF THE INVENTION

1. Field of the Invention

The present invention relates to a CCD (Charge Coupled Device) image sensor used in a television camera and especially to a solid state image sensor which reduces excess charge overflow.

2. Description of the Related Art

Recently, a CCD image sensor that is compact, light, and has long life has been widely used as an alternative to an image pick-up tube. In particular, an interline transfer CCD, which has photodiodes and vertical transfer CCD's arranged two-dimensionally in an image plate, is used for an individual video recorder or a handy camera for broadcasting and so on.

FIG. 1(a) and FIG. 1(b) show sectional views of a structure of one pixel (picture element) in a conventional solid state image sensor.

As shown in FIG. 1(a), an n-type diffusion region 100 is formed on a p-type Si substrate 102 to form photodiode 130. An n-type vertical CCD channel region 104 and an overflow drain 106 are also formed on Si substrate 102. N-type vertical CCD channel region 104 and overflow drain 106 are formed on opposite sides of n-type diffusion region 100. A transfer electrode 108, which also functions as a read out electrode, is formed over vertical CCD channel region 104 on a gate insulating layer 110. An overflow charge control electrode 112 is formed on gate insulating layer 110 between n-type diffusion region 100 and overflow drain 106. A planarizing second insulating layer 114 is formed on the surface of Si substrate 102 and an optical shield 116 is formed on portions of second insulating layer 114 such that an opening 118 is formed above n-type diffusion layer 100. In the sensor, incident light (hv) passes through opening 118 of optical shield 116 and is photoelectrically-converted to signal charge which is stored in photodiode 130. The signal charges are transferred to vertical CCD channel region 104 through a field shift gate region 120 formed under transfer electrode 108 between channel region 104 and diffusion region 100. The signal charges are then sequentially transferred within channel region 104 to output circuitry (not shown). Excess charges generated by a strong incident light are extracted to overflow drain 106 through overflow extraction region 122 beneath overflow charge control electrode 112.

FIG. 1(b) shows another conventional image sensor including a so-called vertical overflow drain structure. That is, a p-type well diffusion layer 102a, whose thickness is thinner under n-type diffusion region 100 and is thicker under vertical CCD channel region 104, is formed on an n-type Si substrate 102, instead of forming an overflow charge control electrode. Excess charges are extracted through the thin portion of p-type well diffusion layer 102a into n-type substrate 102b.

FIG. 3 shows an input/output characteristic graph of the pixel shown in FIG. 1. Specifically FIG. 3 illustrates output current vs. amount of incident light of one CCD pixel as shown in FIG. 1(a) and FIG. 1(b). Within range 204 along the abscissa of the graph shown in FIG. 3, the amount of incident light is low and the output current of the pixel has a substantially linear relationship with the amount of incident light. But if the incident light exceeds a specific amount 206, i.e., the region 202 of the graph, the graph levels off such that the output is saturated. That is, the output current is substantially constant and independent of the amount of incident light. The output current becomes saturated because some of the charges generated by the incident light go over the potential barrier of overflow extraction region 122 and are extracted by the overflow drain. The first region 200 is determined by a difference in the "heights" of potential barriers of field shift region 120 and a potential of overflow extraction region 122 during the reading out operation.

FIG. 2 shows a plot of voltage potential vs. distance along lines X-Y in FIG. 1(a). Numbered portions of the plot designate the potential in corresponding numbered regions of FIG. 1(a). The plot denoted by the solid line illustrates potentials in regions 104, 120, 100, 122 and 106 when the CCD pixel of FIG. 1(a) is in a charge storage state, i.e., when charges are stored in photodiode 130. In the charge storage state, charges isolated in a potential well in n-type region 100 by the potential barriers of field shift gate region 120 and overflow extraction region 122. That is, the potentials in field shift gate region 120 and overflow extraction region 122 are such that charges in the potential well cannot be transferred from n-type region 100. In the charge storage state, the "height" of the potential barrier of field shift gate region 120 is greater than that of overflow extraction region 122.

In a read out state of the CCD pixel shown in FIG. 1(a), a voltage is applied to transfer electrode 108 to lower the potential barrier of region 120. Accordingly, as shown by a dotted line in FIG. 2, charge stored n-type region 100 "spills over" into n-type CCD channel region 104 and is subsequently read out to output circuitry.

However, the "heights" of the potential barriers of the field shift region 120 and overflow extraction region 122 is given by a function of several variables, such as the impurity concentration within these regions and the voltages applied to transfer electrode 108 and overflow charge control electrode 112. Accordingly, the difference between the "heights" of the potential barriers in these regions can vary from pixel to pixel in the CCD. In a pixel which has a small difference in the "heights" of the potential barriers of regions 120 and 122, linear region 200 may be narrow and the output current associated with the second leveled off or saturated region may be lower. In a pixel which has a large potential difference, the first region 200 may be wide and the output current of the second leveled off or saturated region may be excessive. Thus, a CCD having many pixels in which the difference in the "heights" of the potential barriers is not uniform also has a limited dynamic range because excessive amounts of signal charge can traverse the potential barrier "height" of overflow extraction region 122, for example, and are not read out. These charges therefore do not contribute to formation of the image. Accordingly, the image generated by such a CCD may be defective.

The conventional CCD pixel shown in FIG. 1(b) also suffers from problems similar to those described above in regard to the CCD pixel shown in FIG. 1(a).

Another conventional image sensor, shown in FIG. 10 is described in U.S. Pat. No. 4,912,560. A p-type well 300 is formed on a surface of n-type substrate 302. An n-type region 304 is disposed in p-type well 300 to form storage (photo) diode 305. A CCD channel region 306, and n-type region 308 for injecting and extracting charges from channel region 306 are formed in p-type well 300. N-type region 308 and the surrounding p-well constitute a diode for the injection and extraction of charge as will be discussed below.

A pull out electrode 310 is provided in contact with n-type region 304. A pixel electrode 312 is formed over storage diode 305 and CCD channel region 306. In addition, a photoelectric conversion layer 314 and a transparent electrode 316, to which a voltage is applied, are stacked on pixel electrode 312. Element 318, shown in FIG. 10, is a gate for extracting charges and element 319 is a read out gate.

In this type of image sensor a residual image can form as a result of residual charges. Residual charges are those signal charges which are not read out and remain in CCD channel region 306 or in photoelectric conversion layer 314, even though most of the signal charge has been read out through photoelectric conversion layer 314, n-type region 304 of storage diode 305, and CCD channel region 306. To prevent formation of the residual image, after signal charges are read out and before subsequently generated signal charges are stored in storage diode 305, bias charges are injected from injecting/extracting diode 307, through CCD channel region 306, into storage diode 304. The bias charges are then transferred to photoelectric conversion layer 314. The bias charges along with any residual charges are then extracted from photoelectric conversion layer 314, through storage diode 304 and CCD channel region 306, back to injecting/extracting diode 307. Extraction of these residual charges inhibits formation of the residual image.

Injection and extraction of bias charge, as described above, is performed after signal charges are read out and before storage of subsequently generated signal charges. The injection and extraction of bias charge occurs during the vertical blanking $t_1$ period (see FIG. 11) which is determined by the TV format. Photoelectric generation and storage of signal charges are carried out during the effective vertical period $t_2$, also shown in FIG. 11.

FIGS. 12(a) and 12(b) show potentials in the semiconductor regions of FIG. 10. In FIGS. 12(a) and 12(b), the hatched areas indicate the presence of charge carriers (i.e., electrons). Level A in FIGS. 12(a) and 12(b) represents the potential level at the surface of field shift region 317 when a read out potential is applied to gate 319 to read out charge stored in storage diode 305. As seen in FIG. 12(a), when the image sensor is exposed to moderate light intensities, a corresponding amount of charge photoelectrically generated in photoelectric conversion layer 316 is collected or stored in n-type region 304, pull-out electrode 310 and pixel electrode 312. However, when the image sensor is exposed to high intensity light, as seen in FIG. 12(b), only a maximum amount of charge $Q_s$ can be stored in n-type region 304 and electrodes 310 and 312. $Q_s$ may be determined from the following formula:

$$Q_s = (\text{Potential at level A} - \text{Potential at level B}) \times C_s;$$

where the potential at level B is the potential of transparent electrode 316 and $C_s$ is the capacitance of storage diode 305.

Since the potential at level A is a function of several process dependent variables, such as the thickness of the oxide layer overlying the field shift region and the concentration of doping impurities within this region, the potential at level A can vary from pixel to pixel. If the potential at level A in a particular pixel is high, $Q_s$ for that pixel is correspondingly high and the amount of charge transferred to the CCD channel region from the storage diode can be excessive when the image sensor is exposed to high intensity light. Accordingly, the CCD pixel shown in FIG. 10 can have an input/output characteristic similar to that shown in FIG. 3 which suffers from an excessive output saturation current due to the high $Q_s$. Thus, the pixel shown in FIG. 10 also has a reduced dynamic range.

Thus, in both of the conventional CCD image sensors described above, excess charge which is generated in response to a high input light intensity causes a deviation in the maximum or saturated output current of each pixel of the image sensor. Accordingly, the image generated by the image sensor can be defective.

SUMMARY OF THE INVENTION

A first object of the invention is to provide a solid state image sensor which generates an image having fewer defects.

A second object of the invention is to provide a solid state image sensor in which the maximum output current of each pixel is substantially the same.

A third object of the invention is to provide a solid state image sensor having an increased dynamic range.

To attain the objects of the invention, there is provided a semiconductor device comprising: a semiconductor substrate having a first conductivity type and a primary surface; a first semiconductor region having a second conductivity type being formed in the primary surface of said substrate, said substrate substantially surrounding said first semiconductor region; a second semiconductor region having said second conductivity type being formed in the primary surface of said substrate and spaced from said first semiconductor region; transferring means for transferring charge in said first semiconductor region to said second semiconductor region; first means for applying a first potential to said transferring means; second means for applying a second potential to said transferring means; and third means for applying a third potential to said transferring means.

Further in accordance with the present invention, a solid state image sensor is provided which comprises: a substrate having a primary surface; a plurality of photodiodes arranged in a plurality of rows in said primary surface of said substrate, said plurality of photodiodes for photoelectrically generating signal charges and excess charges; a plurality of vertical CCD channel regions formed in the primary surface of said substrate and being respectively located between adjacent rows of said plurality of photodiodes, for receiving the signal charges and excess charges; an overflow drain region formed in the primary surface of said substrate and being spaced from said vertical CCD channel regions for extracting the excess charges from said plurality of vertical CCD channel regions; an insulated gate electrode disposed above each of said plurality of vertical CCD channel regions and portions of the primary surface disposed between said plurality of photodiodes and said plurality of vertical CCD channel regions; first means for applying a first potential to said insulated gate electrode; second means for applying a second potential to said transferring means; and third means for applying a third potential to said transferring means, wherein said first potential is greater than said second potential and said second potential is greater than said third potential.

BRIEF DESCRIPTION OF THE DRAWINGS

The above objects and advantages of the invention will be apparent from the following description, taken in conjunction with the accompanying drawings, in which:

FIGS. 8(a), 8(b), 8(c) and 8(d) show a timing chart of signals associated with the first embodiment.

DETAILED DESCRIPTION OF THE PREFERRED EMBODIMENT

Reference will now De made in detail to the present preferred embodiments of the invention, examples of which are illustrated in the accompanying drawings. Wherever possible, the same reference numbers will be used throughout the drawings to refer to the same or like parts.

As noted above, the difference of the "heights" of the potential barriers of the field shift region and overflow extraction region determine the extent of the range of incident light intensity (amount of incident light) over which the plot of output current vs. amount of incident light is linear. The difference in the potential barrier "heights" of these regions also determines the saturated output current level of the CCD pixel.

In accordance with the present invention, excess charge generated in the photodiode is transferred to the CCD channel region via a field shift region. The excess charge traverses only a single potential barrier, the potential barrier of the field shift gate region. In contrast, in the conventional CCDs described above, charge generated in the photodiode traverses one of two potential barriers, i.e., the potential barrier of either the field shift gate region or the overflow extraction region. Since the linear region of the output characteristic of the conventional CCD pixels is a function of the difference of these two barrier "heights", the linear region can vary from pixel to pixel in the conventional image sensor. In accordance with the present invention, however, only the potential barrier of the field shift region determines the linear region and saturation current level of the output characteristic of the pixel. Since the potential barrier height of only the shift gate region is more readily controlled, as opposed to maintaining a constant difference between two potential barriers, a uniform range of input light intensities (amount of incident light) which yields a linear output current and saturation current level is more easily achieved. Accordingly, the saturated current level can be made uniform for each pixel and the dynamic range can be increased because the output, during generation of excess charges, can be used.

Figure 10:
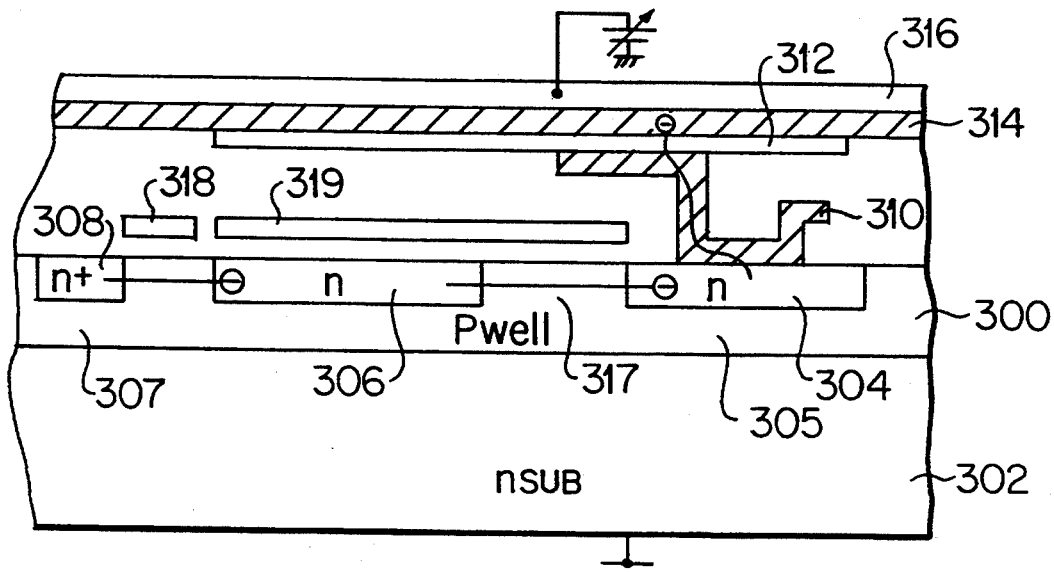
FIG. 10 is a cross-sectional view of a second conventional image sensor.
Figure 11:
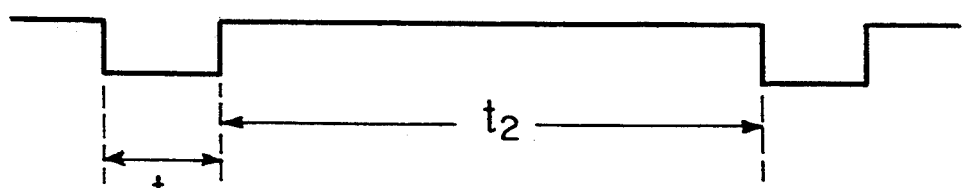
FIG. 11 is a timing chart associated with the conventional image sensor shown in FIG. 10, and FIGS. 12(a) and 12(b) are plots of voltage potentials within regions of the device shown in FIG. 10.

Further, it is noted that in the conventional CCD pixel shown in FIG. 10, one of only two potentials are applied to the read out transfer electrode overlying the field shift region and the CCD channel regions at any given time. Upon application of one potential to the read out transfer electrode, charge is isolated from the CCD channel region. Upon application of the second potential, charge, including excess charge, is transferred from the storage diode to the CCD channel region where it is subsequently read out.

However, in accordance with an additional feature of the present invention, one of three potentials is applied to the read-out transfer electrode at any particular time. A low potential is applied to the read-out transfer electrode to isolate charge from the CCD channel region. An intermediate potential is also applied which removes excess charge in the storage diode to the CCD channel region where it is subsequently transferred to an overflow drain. Upon application of a high potential, charge in the storage diode is transferred to the CCD channel region where it is subsequently transferred to read out circuitry of the image sensor.

Figure 12A:
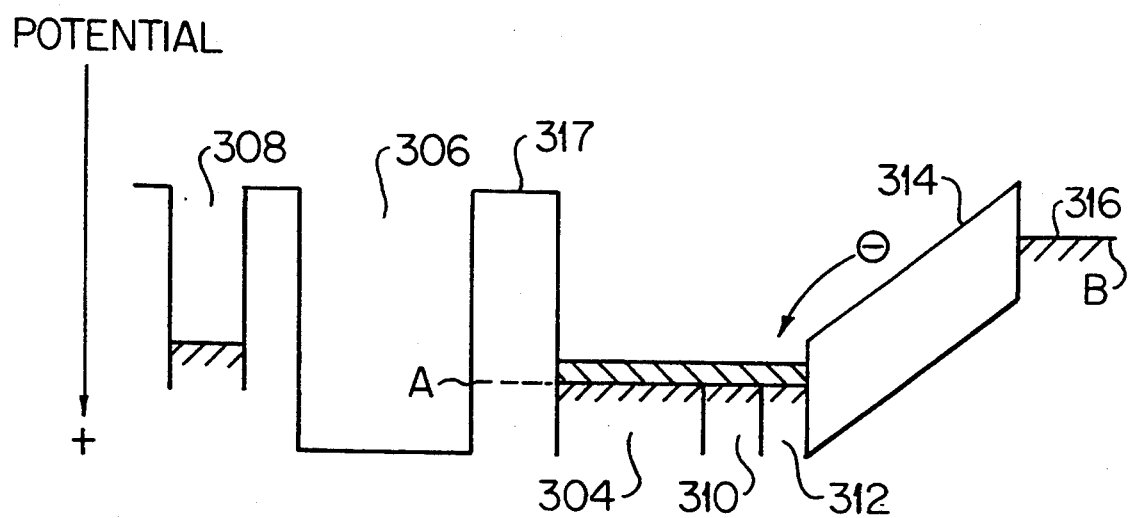
Figure 12B:
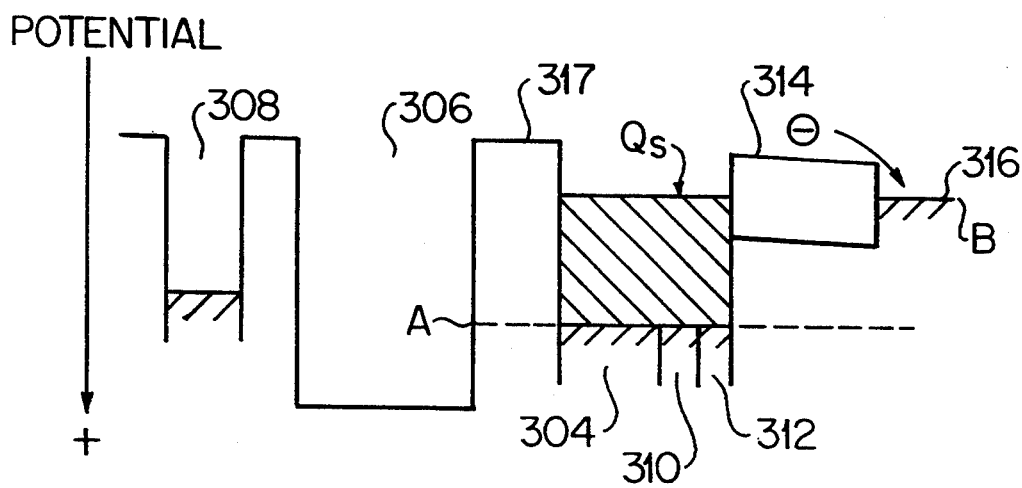

Application of the intermediate potential facilitates removal of excess charge in the storage or photodiode while signal charges remain in the photodiode. Accordingly, even though the potential level A (see FIGS. 12(a) and 12(b)) can vary from pixel to pixel, the maximum current output, i.e., the saturation current, to the read out circuitry from each pixel can be made substantially the same. Accordingly, the dynamic range of the image sensor is improved.

Figure 1A:
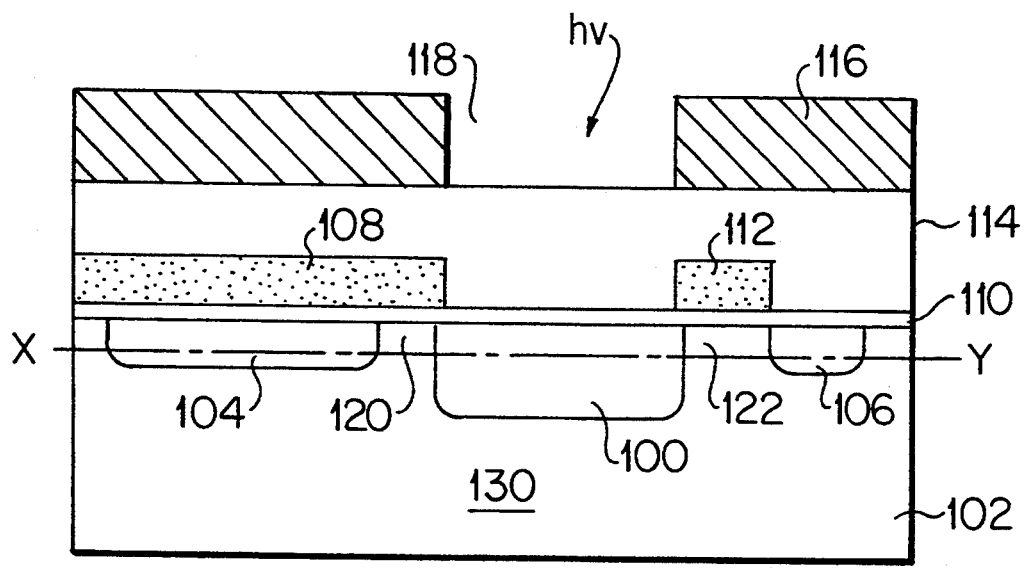
FIG. 1(a) and FIG. 1(b) are sectional views of the conventional solid state image sensor.
Figure 1B:
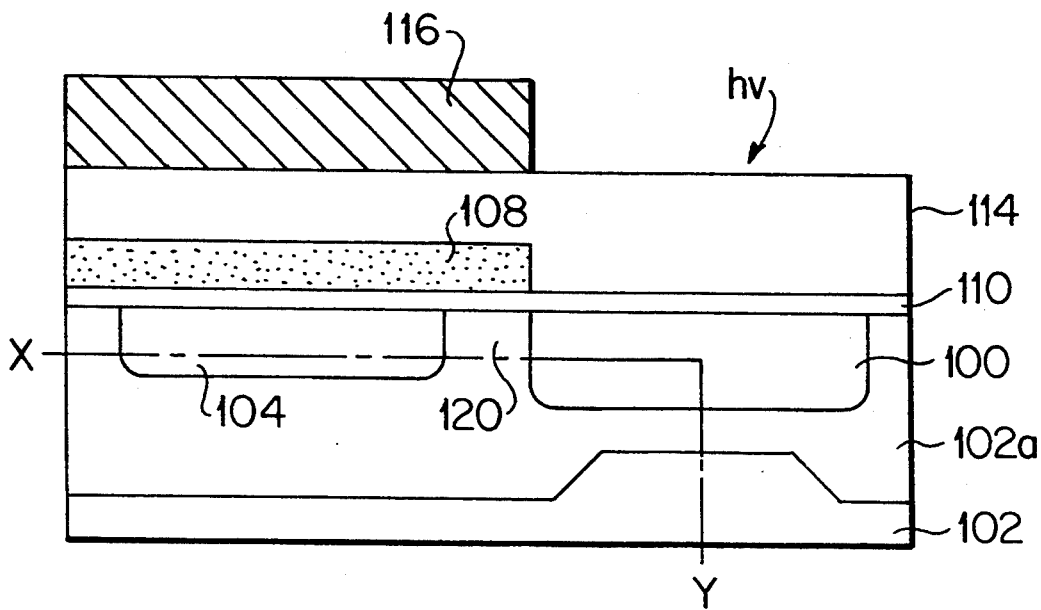
Figure 2:
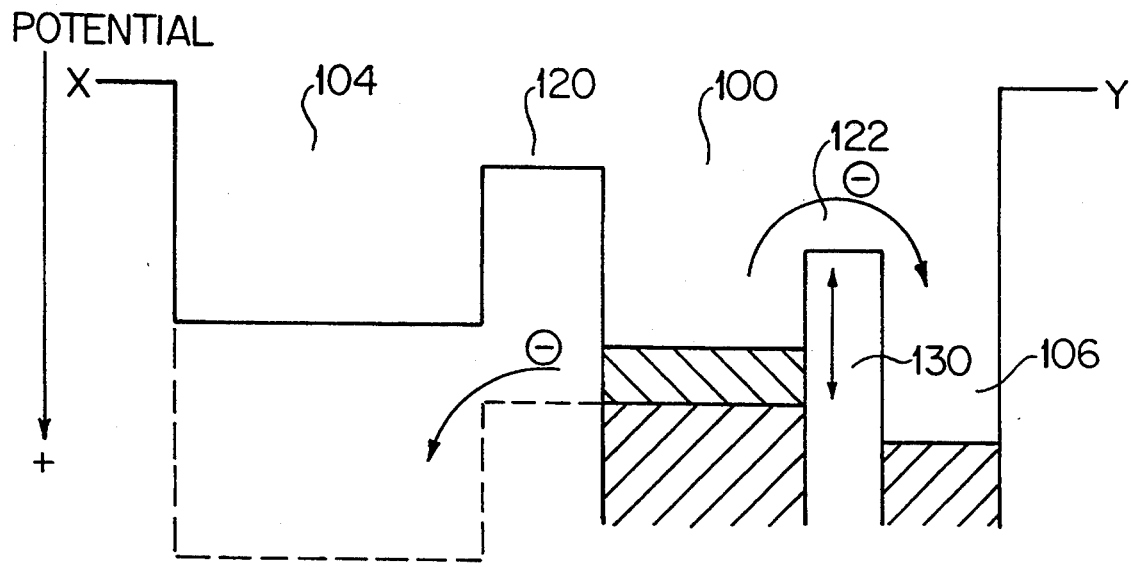
FIG. 2 is a plot of voltage potential vs. distance along lines X-Y in FIG. 1(a)
Figure 3:
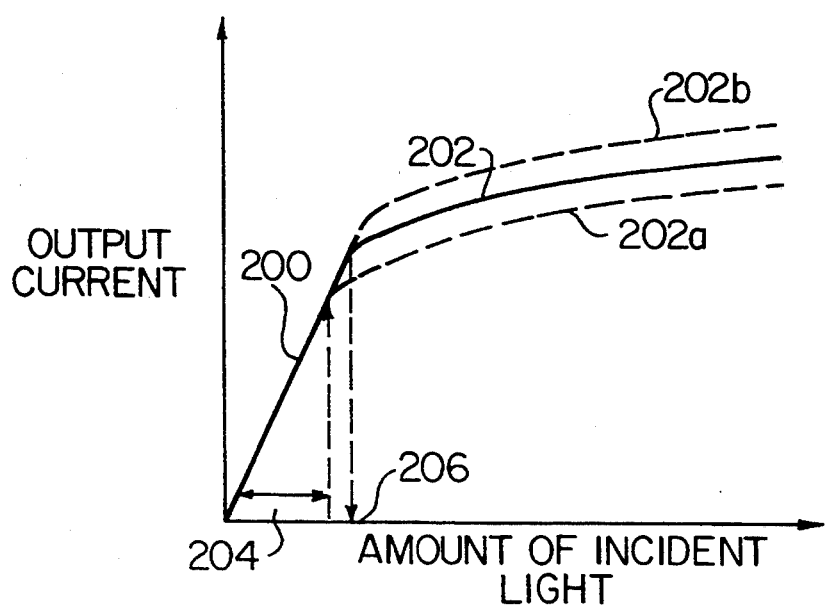
FIG. 3 is an input/output characteristic graph according to the conventional solid state image sensor.
Figure 4:
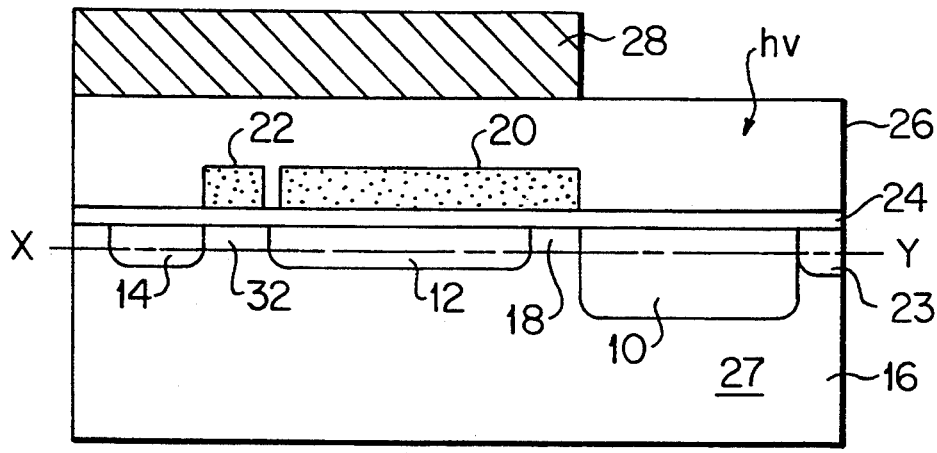
FIG. 4 shows a schematic sectional view of a pixel of a solid state image sensor according to a first embodiment of the present invention.

A first embodiment in accordance with the present invention will now be described with reference to FIG. 4. As seen in FIG. 4, a photodiode 27 including n-type region 10 is formed on the surface of Si substrate 16. N-type vertical CCD channel region 12 and an n-type overflow drain region 14, are diffused into the surface of a p-type Si substrate 16. Overflow drain 14 and photodiode 27 are positioned on opposite sides of CCD channel region 12. A field shift region 18 is formed between n-type region 10 and vertical CCD channel region 12. An overflow extraction region 32 is formed between vertical CCD channel region 12 and overflow drain 14. A read out/transfer electrode 20 and an overflow potential control electrode 22 are formed on substrate 16 on insulating layer 24.

Read out/transfer electrode 20 is formed on field shift region 18 and vertical CCD channel region 12. Overflow potential control electrode 22 is formed over overflow extraction region 32. A planarizing second insulating layer 26 is formed so as to cover read out/transfer electrode 20 and overflow potential control electrode 22. Optical shield 28 which has an opening 30 over n-type region 10, is formed on insulating layer 26. In addition, a Si layer (not shown in the figure) can be formed, so as to improve the efficiency of photodiode 27. Preferably, arrays of photodiodes are isolated by p+ diffusion layer 23.

In the device shown in FIG. 4, light (hv) incident through opening 30 of optical shield 28 is photoelectrically converted in the depletion region formed at the junction of n-type region 10 and p-type substrate 16 and stored as signal charge. The signal charge is transferred through field shift region 18 under transfer electrode 20 and moves into vertical CCD channel region 12.

Excess charges generated at photodiode 27 by a strong incident light, are transferred through field shift region 18 to vertical CCD channel region 12 and then through overflow extraction region 32 to overflow drain 14.

The operation of the device shown in FIG. 4 will now be described with reference to FIG. 5 which shows a plot of voltage potential taken along line X–Y in FIG. 4.

Figure 5:
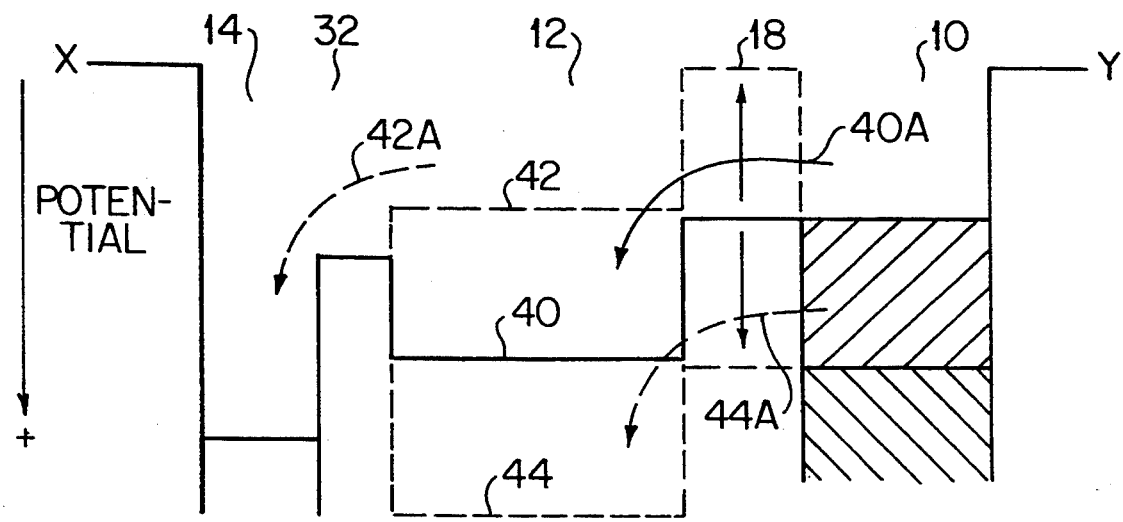
FIG. 5 shows a potential graph of operational modes, taken along line X-Y in FIG. 4.

The plot denoted by the solid line 40 in FIG. 5 shows the potential along line X–Y in FIG. 4 while signal charges are stored in photodiode 27. If excess charge accumulates in photodiode 27, the excess charge is transferred to vertical CCD channel region 12 (as indicated by arrow 40A) through field shift gate region 18. Signal charges, however, remain stored in photodiode 27. During this operation, 7 V and 13 V are respectively applied to overflow drain 14 and overflow gate 32.

Application of the intermediate potential to gate 20 is represented by solid line 40 in regions 12 and 18.

A first dotted line 42 in FIG. 5 shows potentials in regions 12 and 18 when a low level of voltage, for example, 0 V is applied to read out/transfer electrode 20. The low level voltage is applied prior to the read out of signal charges stored in photodiode 10 to vertical CCD channel region 12. Upon application of the low potential, charges remaining in vertical CCD channel region 12, including excess charges from photodiode 27, are transferred to overflow drain region 14 (as indicated by arrow 42A) through overflow extraction region 32. In this case, the potential of vertical CCD channel region 12 is set to be approximately 5 V.

A second dotted line 44 in the figure shows the potential along line X–Y during reading out of signal charges from photodiode 27. Signal charges are transferred to vertical CCD channel region 12 from photodiode 27 by applying a high level of voltage, such as 10 V, to electrode 20. In this case the transfer of signal charges is indicated by arrow 44A in FIG. 5. It should be noted that the potential barrier of region 18 is "lowered" more upon application of the high potential than it is upon application of the intermediate potential. Thus, excess charge is transferred out of photodiode 27 upon application of the intermediate potential and signal charge are transferred out of photodiode 27 upon application of the high potential.

Figure 6:
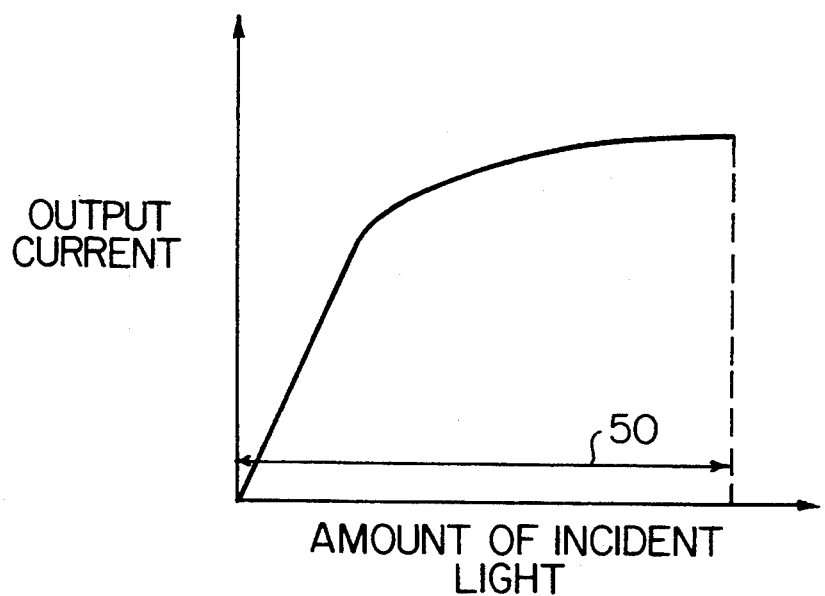
FIG. 6 shows an input/output characteristic graph according to the first embodiment of the present invention.

As described above, the storing of signal charges, the reading out of signal charges and the extraction of excess charges can be carried out by applying one of three corresponding voltages to transfer electrode 20. Moreover, since excess and signal charges are transferred across a single region 18 instead of one of two regions as in the conventional image sensor pixel described above and the potential of the field shift gate can be made constant for each pixel, the saturated output current can be made uniform for each pixel. Thus, each pixel in the image sensor array according to the present invention has an output characteristic similar to that shown in FIG. 6. Since each pixel has substantially the same output characteristic, even when excess charges are generated, there is little deviation in the saturated current level of each pixel and the dynamic range is increased.

Figure 7:
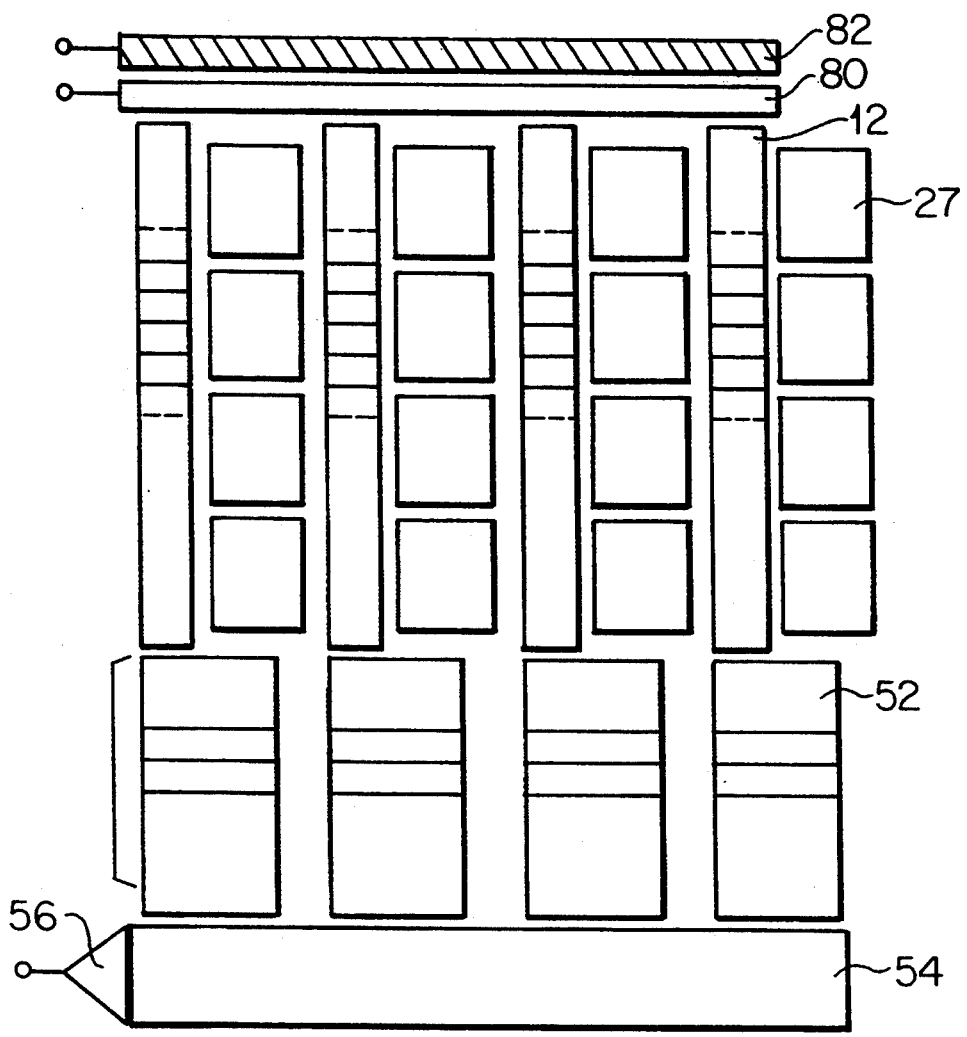
FIG. 7 shows a schematic view of an image sensor array according to the first embodiment.

As is apparent from the above description, the vertical CCD channel region extracts excess charges to the overflow drain and transfers signal charges to the read out circuitry. Thus, the image sensor of the first embodiment may be incorporated into a frame interline transfer (FIT) CCD image sensor, as shown in FIG. 7. The FIT CCD image sensor comprises an exposed region, including a plurality of photodiodes 27 arrayed in a matrix, vertical CCD channel regions 12 arrayed between adjacent arrays of photodiodes 27, overflow drains 80, a memory region 52 comprising a CCD and being adjacent to the exposed region, a horizontal CCD 54, and an output amplifier 56. In this structure, vertical CCD channel regions 12 transfer signal charges during the vertical blanking period of the TV format and serve as a path for extraction of excess charge during the effective vertical period of the TV format.

A timing chart of the FIT CCD image sensor is shown FIG. 8. FIG. 8(a) shows a composite blanking signal associated with the TV format. The composite blanking signal comprises a vertical blanking pulse 60 and a horizontal pulse 62. FIG. 8(b) shows a driving signal which is applied to read out/transfer electrode 20 of FIG. 4. The driving signal includes an extracting pulse 64 (corresponding to the low potential) which is applied to read out/transfer electrode 20 to extract charges remaining in vertical CCD channel region 12. A field pulse 66 (corresponding to the high potential) is applied to read out/transfer electrode 20 in order to transfer signal charges from photodiode 27 to vertical CCD channel region 12. A high speed transfer pulse 68 is applied to read out transfer electrode 20 in order to transfer signal charges within vertical CCD region 12 to memory CCD 32. An overflow pulse 70 (corresponding to the intermediate potential) is applied to read out/transfer electrode 20 for extracting excess charges generated in photodiode 27. Overflow pulse 70 is set to a predetermined voltage which is intermediate between the lower voltage (e.g., 0 V) and the higher voltage (e.g., 10 V). The pulse width of overflow pulse 70 is substantially equal to the time between high speed transfer pulse 68 and the extracting pulse 64a of the next period.

FIG. 8(c) shows a transfer signal of the memory CCD 12. The transfer signal includes a second high speed transfer pulse 72, similar to high speed transfer pulse 68, and a line shift pulse 74. Line shift pulse 74 serves to transfer signals corresponding to one row of the image into horizontal CCD 54. FIG. 8(d) shows horizontal transfer pulses 76 which are applied to horizontal CCD 54 for sequentially transferring signals of one line of the image at a time to output amplifier 56.

In the FIT CCD described above, first, charges remaining in vertical CCD region 12 are extracted, second, charges stored in photodiode 10 are read out to vertical CCD region 12, and third, signal charges are transferred into memory CCD 53 from vertical CCD 12. Photodiode 27 stores signal charges during the effective vertical period which is substantially equal to the time between high speed transfer pulse 68 and the extracting pulse 64a of the next period, i.e., the pulse width of overflow pulse 70. Excess charges generated during the effective vertical period in photodiode 27 by strong incident light are transferred to vertical CCD region 12 through field shift gate region 18. That is, excess charges are transferred to CCD region 12 while signal charges are stored in photodiode 27. During the vertical blanking period, signal charges of memory CCD 12 are read out to horizontal CCD 54 and output through output amplifier 56. As described above, excess charges are extracted to the overflow drain which is located adjacent vertical CCD region 12 and opposite photodiode 27. However, as seen in FIG. 7, extraction gate 80 and extraction drain 82 (i.e., the overflow drain) may be formed adjacent to one side of vertical CCD region 12 and not necessarily opposite photodiode 27.

According to the first embodiment, as excess charges generated by a strong incident light are extracted into overflow drain 14 through field shift region 18 and vertical CCD region 12, the amount of excess charge extracted is determined by the "height" of the potential barrier of field shift region 18. Accordingly, the saturation current level can be made uniform for each pixel and dynamic range can be increased.

Figure 9:
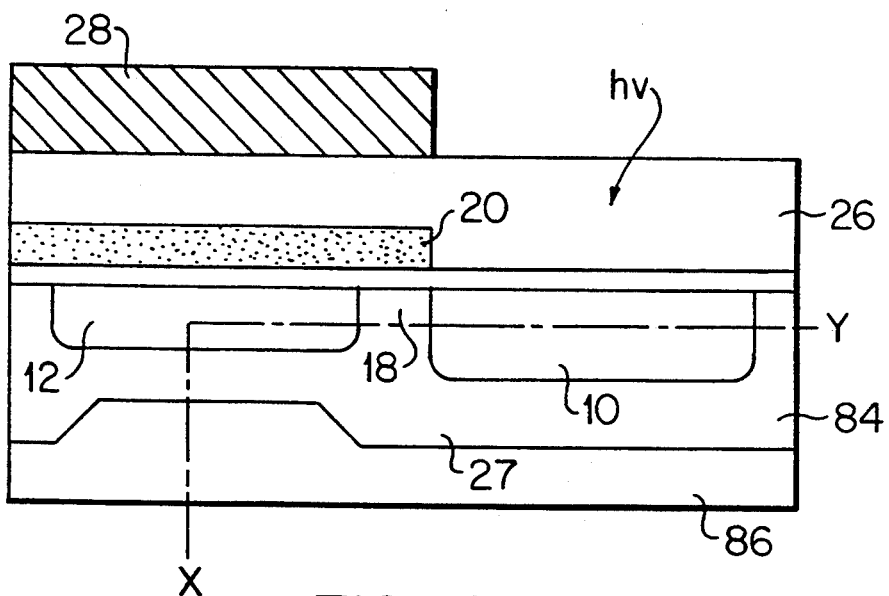
FIG. 9 shows a sectional view of a pixel of a solid state image sensor according to a second embodiment of the present invention.

A second embodiment of the invention will now be described with reference to FIG. 9. FIG. 9 is a schematic sectional view of an image sensor pixel according to the second embodiment. Reference numerals common to both FIGS. 4 and 9 denote similar structures in these figures. Accordingly, reference is made to the above discussion of FIG. 4 for a description of structures common both to FIGS. 4 and 9.

In contrast to the first embodiment, the second embodiment includes a vertical overflow drain which is provided beneath vertical CCD region 10. That is, p-type well 84 is formed on an n-type Si substrate 86 and on n-type region 10 is diffused in p-type well 84 to form photodiode 27. P-type well 84 is formed to be thinner below CCD channel region 12 and thicker below photodiode 27. N-type Si substrate 86 beneath CCD channel region 12 serves as the overflow drain. The basic operation of this structure is similar to that of the first embodiment. Excess charges generated in photodiode 27 are extracted into substrate 86 along a path X-Y shown in FIG. 9. That is, excess charges are extracted from photodiode 27, through field shift region 18, to CCD channel region 12. The excess charge then moves into substrate 86 through the thin portion of well region 84 between CCD channel region 12 and substrate 86. Accordingly, similar advantages to those of the first embodiment can be obtained herein.

Numerous modifications and variations of the present invention are possible in light of the above teachings. It is therefore to be understood that, within the scope of the appended claims, the present invention can be practiced in a manner other than as specifically herein. For example, in the first and second embodiments, the overflow drain and photodiode 27 are provided on opposite sides of the vertical CCD channel region or below the vertical CCD channel region. However, the overflow drain can have other structures such that excess charges in photodiode 27 may be extracted through the vertical CCD channel region.

What is claimed is:

1. A semiconductor device comprising:
    a semiconductor substrate having a first conductivity type and a primary surface;
    a first semiconductor region formed in the primary surface of said substrate, said substrate substantially surrounding said first semiconductor region, said first semiconductor region having charge, including excess charge, photoelectrically generated therein;
    a second semiconductor region having a second conductivity type formed in the primary surface of said substrate and spaced from said first semiconductor region through a field shift region;
    a third semiconductor region having a second conductivity type and spaced from said first and second semiconductor regions, said third semiconductor region for extracting said excess charge from said second semiconductor region;
    reading out and transferring means, disposed over said second semiconductor region and said field shift region, for reading out and transferring charge in said first semiconductor region to said second semiconductor region;
    a potential applying means for applying a first potential, a second potential, and a third potential to said reading out and transferring means, at least two of said potentials are potentials to render the field shift region highly conductive, and said second potential is between said first potential and said third potential in potential height, said second potential being applied to said reading out and transferring means while said photoelectrically generated charge other than said excess charge is present in said first semiconductor region.

2. A semiconductor device according to claim 1, wherein said first potential is applied for extracting substantially all excess charge in said second region to said third region and said second potential is applied for removing excess charge in the first region to said third region through said second region and said third potential is applied for transferring charge in said first region to said second region.

3. A semiconductor device according to claim 1 wherein said third semiconductor region is located in the primary surface of said substrate.

4. A semiconductor device according to claim 1 wherein said third semiconductor region is located in said substrate and spaced from the primary surface of said substrate.

5. A semiconductor device according to claim 1, wherein said second potential is applied to said reading out and transferring means during an effective vertical period of a television format.

6. A semiconductor device according to claim 1 wherein said first region and at least a portion of said substrate surrounding said first region constitutes a photodiode.

7. A semiconductor device according to claim 1 wherein said second region constitutes a CCD channel region.

8. A semiconductor device according to claim 1 wherein said third region constitutes an overflow drain region.

9. A solid state image sensor comprising:
    a substrate having a primary surface;
    a plurality of photodiodes arranged in a plurality of rows in said primary surface of said substrate, said plurality of photodiodes for photoelectrically generating charge;
    a plurality of vertical CCD channel regions formed in the primary surface of said substrate and being respectively located between adjacent rows of said plurality of photodiodes;
    an overflow drain region formed in the primary surface of said substrate and being spaced from said photodiodes and said vertical CCD channel regions through a field shift region;

a plurality of insulated gate electrodes disposed above each of said plurality of vertical CCD channel regions and portions of the primary surface disposed between said plurality of photodiodes and said plurality of vertical CCD channel regions;

first means for applying a first potential to said plurality of insulated gate electrodes;

second means for applying a second potential to said plurality of insulated gate electrodes which render said field shift region highly conductive, whereby a first portion of the photoelectrically generated charge in said plurality of photodiodes is transmitted to said plurality of CCD channel regions, while a second portion of the photoelectrically generated charge remains in said plurality of photodiodes, and thereafter a substantial portion of the first portion of photoelectrically generated charge is transferred to the overflow drain from said plurality of vertical CCD channel regions, a remaining portion of said first portion of photoelectrically generated charge in said vertical CCD channel region being transferred to said overflow drain during application of the first potential by said first means;

third means for applying a third potential to said plurality of insulated gate electrodes to transfer said second portion of the photoelectrically generated charge to said plurality of vertical CCD channel regions after said substantial and remaining portions of the first portion of photoelectrically generated charge have been transferred to said overflow drain region, wherein said third potential is greater than said second potential and said second potential is greater than said first potential.

10. A solid state image sensor according to claim 9, wherein said solid state image sensor is a frame interline transfer charge coupled device.

11. A solid state image sensor according to claim 9, wherein the first portion of the photoelectrically generated charge is an excess charge.

12. A solid state image sensor according to claim 9, wherein the second portion of the photoelectrically generated charge is a signal charge.

13. A solid state image sensor according to claim 9 further comprising:

read-out circuit means for receiving said second portion of photoelectrically generated charge from said plurality of CCD channel regions; and second transferring means for transferring said second portion of photoelectrically generated charge from said plurality of CCD channel regions to said read-out circuit means.

* * * * *